(12) United States Patent
Manabe et al.

(10) Patent No.: US 7,790,517 B2
(45) Date of Patent: Sep. 7, 2010

(54) METHOD OF MANUFACTURING SEMICONDUCTOR DEVICE

(75) Inventors: Kazutaka Manabe, Tokyo (JP); Eiji Kitamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 321 days.

(21) Appl. No.: 11/854,225

(22) Filed: Sep. 12, 2007

(65) Prior Publication Data
US 2008/0090363 A1    Apr. 17, 2008

(30) Foreign Application Priority Data
Oct. 13, 2006    (JP) .............................. 2006-279521

(51) Int. Cl.
| | |
|---|---|
| H01L 21/82 | (2006.01) |
| H01L 21/336 | (2006.01) |
| H01L 21/38 | (2006.01) |
| H01L 21/22 | (2006.01) |
| H01L 21/44 | (2006.01) |

(52) U.S. Cl. .................. 438/131; 438/289; 438/584; 438/549; 438/600; 257/334; 257/379; 257/391; 257/392; 257/530

(58) Field of Classification Search .............. 438/215, 438/217, 289, 290, 514–534, 548, 549, 600, 438/601; 257/529–530, 334, 379, 391, 392
See application file for complete search history.

(56) References Cited

U.S. PATENT DOCUMENTS

| | | | | |
|---|---|---|---|---|
| 4,597,824 A | * | 7/1986 | Shinada et al. | 438/305 |
| 5,014,099 A | * | 5/1991 | McElroy | 257/302 |
| 5,110,754 A | * | 5/1992 | Lowrey et al. | 438/386 |
| 5,282,158 A | * | 1/1994 | Lee | 365/96 |
| 5,331,196 A | * | 7/1994 | Lowrey et al. | 257/529 |
| 6,794,726 B2 | * | 9/2004 | Radens et al. | 257/530 |
| 2002/0175367 A1 | * | 11/2002 | Hshieh et al. | 257/339 |
| 2006/0220140 A1 | * | 10/2006 | Robb et al. | 257/371 |

FOREIGN PATENT DOCUMENTS

JP    2004-111957 A    4/2004

* cited by examiner

*Primary Examiner*—Ha Tran T Nguyen
*Assistant Examiner*—Karen M Kusumakar
(74) *Attorney, Agent, or Firm*—Sughrue Mion, PLLC

(57) ABSTRACT

A method of manufacturing a semiconductor device forms an $N^-$ diffusion layer to be a source/drain region of a grooved transistor simultaneously with an $N^-$ diffusion layer of a channel region directly under a gate electrode of an antifuse element. The formation of the $N^-$ diffusion layer directly under the gate electrode of the antifuse element stabilizes electrical connection between the gate electrode and the source/drain diffusion region even during writing with a low write voltage.

14 Claims, 3 Drawing Sheets

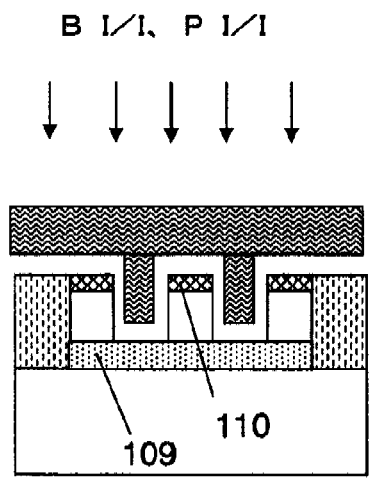
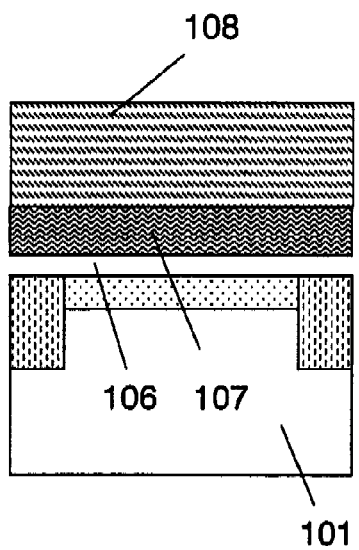
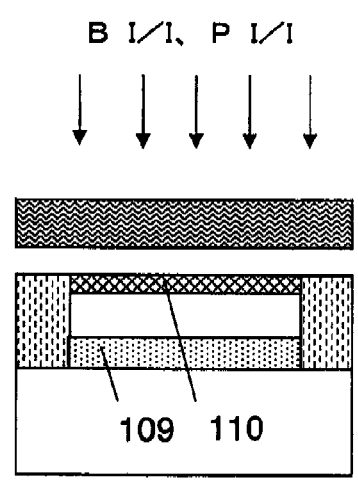
FIG. 6A          FIG. 6B          FIG. 6C
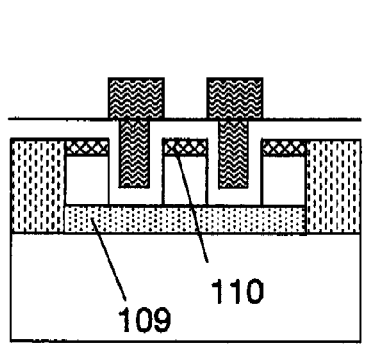
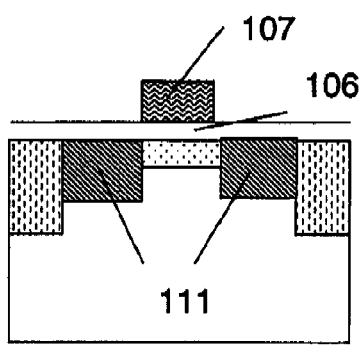
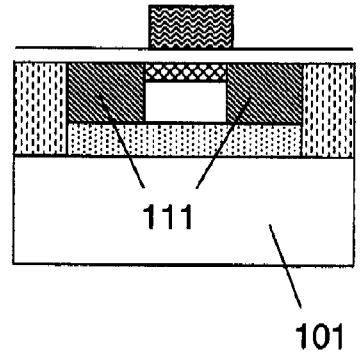
FIG. 7A          FIG. 7B          FIG. 7C

METHOD OF MANUFACTURING SEMICONDUCTOR DEVICE

This application is based upon and claims the benefit of priority from Japanese patent application No. 2006-279521, filed on Oct. 13, 2006, the disclosure of which is incorporated herein in its entirety by reference.

BACKGROUND OF THE INVENTION

1. Field of the Invention

The present invention relates to a method of manufacturing a semiconductor device, and in particular to a method of manufacturing a semiconductor device having a grooved transistor and an antifuse element.

2. Description of the Related Art

The semiconductor device technology has been evolved year by year, enlarging the scale and capacity of semiconductor devices. As for typical semiconductor storage devices, for example, 1 Gbit dynamic random access memories (DRAMs) have been commercialized. Such large-capacity semiconductor devices employ a redundant circuit for substituting and remedying a defective memory cell. The redundant circuit remedies a defective memory cell by storing an address of the defective memory cell in a nonvolatile storage element and switching to an auxiliary memory cell. Thus, the redundant circuit for substituting and remedying a defective memory cell is used to improve the yield and to reduce the cost of semiconductor devices.

The nonvolatile storage elements applicable to such redundant circuits include a fuse element which fuses a polysilicon or metal wiring with laser or high current, and an antifuse element which breaks and short-circuits a polysilicon or metal wiring by applying a high voltage equivalent to a critical voltage or higher. In recent years, the antifuse element has become employed in many cases for such reasons that write is possible even after a packaging process, and power consumption is low since current required to break an insulating film is lower than current required to blow a wiring. Thus, semiconductor devices having an antifuse element have become more common.

Such antifuse elements are applicable widely. For example, an antifuse element is usable not only to replace a defect address in a redundant circuit as described above, but also to adjust the timing of a delay circuit, to control an internal voltage, and to change the bit or word organization of a storage device. Because of such wide applications, it is desired for the antifuse elements to be writable even after packaging of a semiconductor device, and to be stably low in resistance after the writing.

The antifuse element, which is a nonvolatile storage element, will be described with reference to FIGS. 1 and 2.

The antifuse element shown in FIG. 1 is of a type that breaks a gate insulating film, and is manufactured by a similar method to that for ordinary MOS transistors. In FIG. 1, a gate oxide film 202 and a gate electrode 203 are formed on a P-type semiconductor substrate 201. Further, the P-type semiconductor substrate 201 is formed with an $N^+$ source/drain diffusion region 204.

Writing to this transistor-type antifuse element is performed by applying a positive high voltage to the gate electrode 203 to form a channel in the surface of the P-type semiconductor substrate 201, while breaking the gate oxide film 202. This breakdown location 205 becomes an N-type semiconductor since the gate electrode is of an N-type in general. Therefore, if the scale of the breakdown is small, a problem is induced that electrical connection is not stable between the breakdown location 205 and the $N^+$ source/drain diffusion region 204. Accordingly, application of a high voltage is required to ensure large breakdown and stable electrical connection.

Japanese Laid-Open Patent Publication No. 2004-111957 (Patent Document 1) discloses a method of ensuring such stable electrical connection.

As shown in FIG. 2, an $N^-$ diffusion layer 301 is formed on the surface of the P-type semiconductor substrate 201 directly below the gate electrode 203. The breakdown location 205 is thus stably electrically connected to an $N^-$ diffusion layer 301. This solves the problem of instable electrical connection between the breakdown location 205 and the $N^+$ source/drain diffusion region 204. However, a lithography process and a channel implantation process are additionally required to form the $N^-$ diffusion layer 301. Thus, new problems occur such as increased number of process steps and increased cost. There is a demand for development of antifuse elements which do not involve a problem of increased cost.

SUMMARY OF THE INVENTION

As described above, there is currently a problem that electrical connection at a breakdown location becomes instable during writing to an antifuse element. When an $N^-$ diffusion layer is formed to solve this problem, there occurs other problems such as increased number of process steps and increased cost. In view of these problems, it is an object of the present invention to provide a method of manufacturing an antifuse element without involving increase in cost.

In order to solve the problems above, the present invention basically employs the technologies described below. It should be understood that various improvements, modifications, and equivalents can be made without departing from the scope of the invention.

The present invention relates to a method of manufacturing a semiconductor device having an antifuse element and a grooved transistor, and the method includes: a step of forming a groove for the grooved transistor; a step of forming a gate insulating film; a step of forming a gate electrode film; and a diffusion layer formation step of simultaneously forming a diffusion layer in a source/drain diffusion region for the grooved transistor and in a channel region for the antifuse element.

In the method of manufacturing a semiconductor device according to the present invention, the diffusion layer formation step preferably forms the diffusion layer by implanting ions from above the gate electrode film.

In the method of manufacturing a semiconductor device according to the present invention, the diffusion layer formation step preferably introduces an impurity into a shallow region from the surface of a semiconductor substrate by phosphorus ion implantation using phosphorus as the source.

In the method of manufacturing a semiconductor device according to the present invention, the diffusion layer formation step preferably dopes the channel region of the grooved transistor by boron ion implantation prior to conducting the phosphorus ion implantation.

In the method of manufacturing a semiconductor device according to the present invention, the depth of the phosphorus ion implantation may be smaller than the depth of the boron ion implantation.

In the method of manufacturing a semiconductor device according to the present invention, boron is preferably introduced underneath the channel region of the antifuse element by the boron ion implantation.

In the method of manufacturing a semiconductor device according to the present invention, boron is preferably introduced into an underside region of the source/drain diffusion region of the grooved transistor by the boron ion implantation.

In the method of manufacturing a semiconductor device according to the present invention, the boron ion implantation and the phosphorus ion implantation are preferably performed by the use of a same resist pattern to implant the boron ions and the phosphorus ions, respectively.

The method of manufacturing a semiconductor device according to the present invention forms an N⁻ diffusion layer to be a source/drain diffusion region of the grooved transistor simultaneously with an N⁻ diffusion layer of a channel region directly below the gate of the antifuse element. The formation of the N⁻ diffusion layer directly below the gate of the antifuse element ensures stable electrical connection between the gate electrode and the source/drain diffusion region even if the breakdown of the antifuse element caused by writing is small. Therefore, an advantageous effect can be obtained that the writing to the antifuse element is possible at a relatively low voltage. Further, the simultaneous formation of the N⁻ diffusion layers eliminates the need of increasing the number of process steps or the cost especially for formation of the antifuse element, and thus enables low-cost manufacture. According to the method of manufacturing a semiconductor device of the present invention, an antifuse element having a stable writing characteristic and a semiconductor device having such an antifuse element can be obtained without involving increase in the number of process steps or cost.

BRIEF DESCRIPTION OF THE DRAWINGS

FIGS. 6A to 6C are fourth cross-sectional views showing the semiconductor device in the diffusion process according to the present invention; and FIGS. 7A to 7C are fifth cross-sectional views showing the semiconductor device in the diffusion process according to the present invention.

DESCRIPTION OF THE PREFERRED EMBODIMENTS

A method of manufacturing a semiconductor device according to the present invention will be described with reference to FIGS. 3 to 7. FIGS. 3 to 7 are cross-sectional views showing principal steps of the method of manufacturing a semiconductor device. The left side diagram with the alphabetic suffix "A" of each figure is a cross-sectional view showing a grooved memory cell portion formed by a grooved NMOS transistor, the central diagram with the alphabetic suffix "B" is a cross-sectional view showing an ordinary NMOS transistor portion, and the right side diagram with alphabetic suffix "C" is a cross-sectional view showing an antifuse element portion. Description herein will be made principally of formation of a transistor relating to the nature of the present invention.

Figure 1:
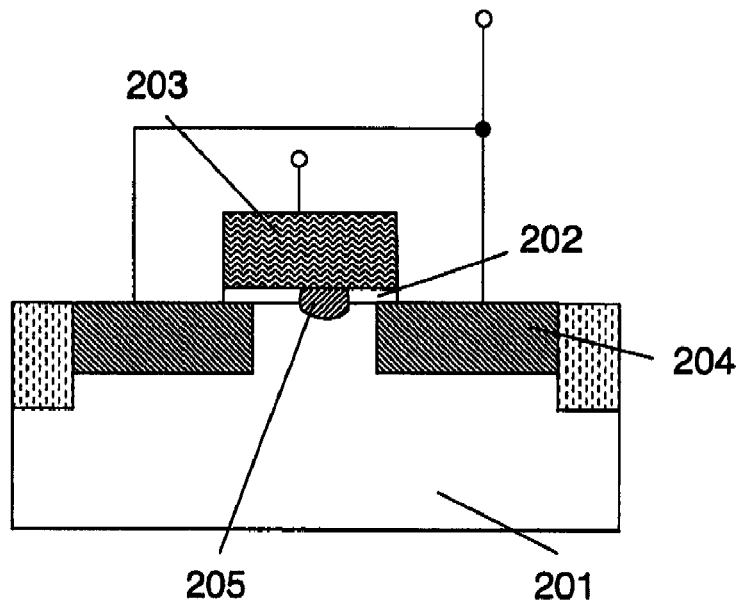
FIG. 1 is a first cross-sectional view of a semiconductor device according to a related art.
Figure 2:
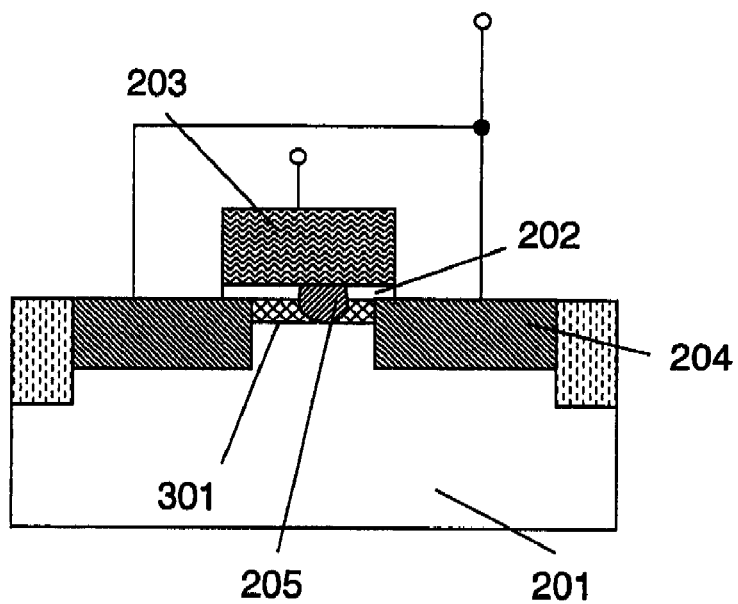
FIG. 2 is a second cross-sectional view of a semiconductor device according to a related art.
Figure 3A:
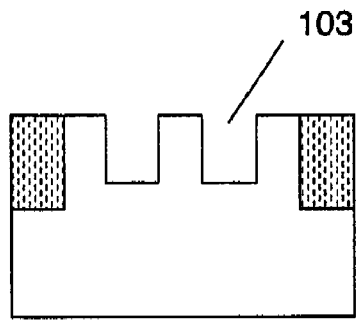
FIGS. 3A to 3C are first cross-sectional views showing a semiconductor device in a diffusion process according to the present invention.
Figure 3B:
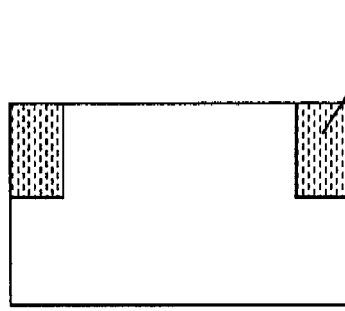
Figure 3C:
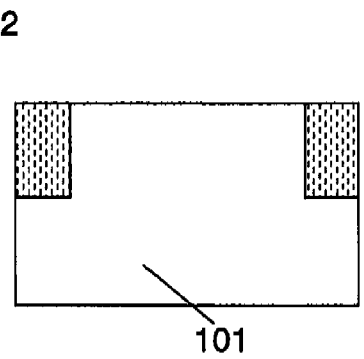

At first, an element isolation trench with a depth of 250 nm for example is formed in the surface of a P-type semiconductor substrate 101 by a commonly used method. The trench is then filled with an element isolation insulating film 102. As shown in FIG. 3A, a groove 103 for grooved NMOS transistor is then formed to a depth of 200 nm for example.

Figure 4A:
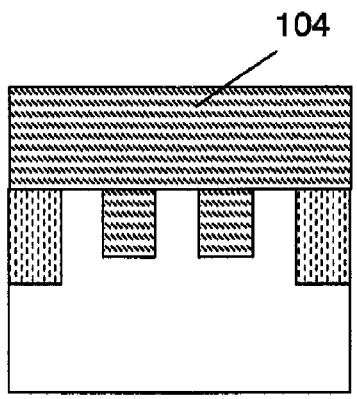
FIGS. 4A to 4C are second cross-sectional views showing the semiconductor device in the diffusion process according to the present invention.
Figure 4B:
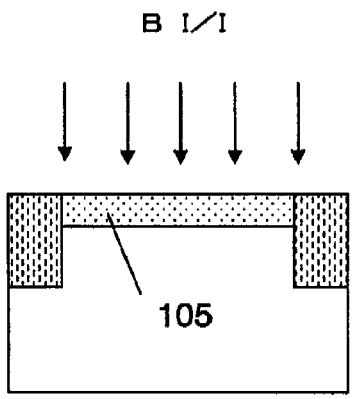
Figure 4C:
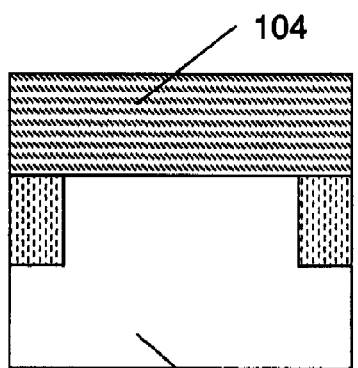

Subsequently, as shown in FIGS. 4A and 4C, the grooved memory cell portion and the antifuse element portion are covered with a resist 104. Further, the substrate surface of the NMOS transistor portion is selectively channel-doped for adjustment of threshold voltage (Vt) of the NMOS transistor. Boron is implanted at a dose of 2e12 cm⁻² at 20 keV, for example, to form a P-type channel doped region 105, as shown in FIG. 4B.

Figure 5A:
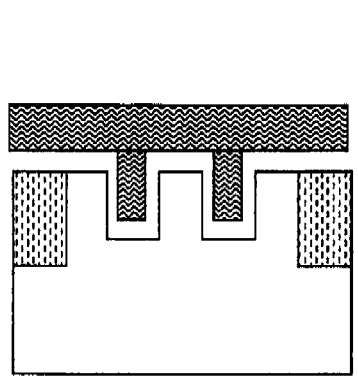
FIGS. 5A to 5C are third cross-sectional views showing the semiconductor device in the diffusion process according to the present invention.
Figure 5B:
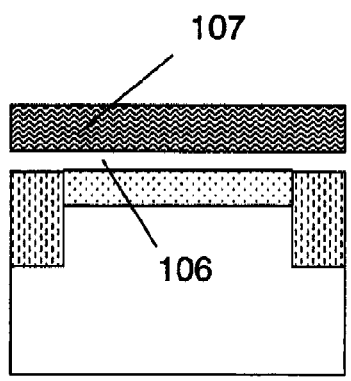
Figure 5C:
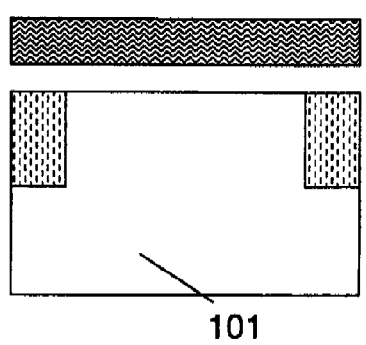

Then, as shown in FIGS. 5A through 5C, a gate oxide film 106 having a thickness of 7 nm for example is formed. When two types of gate oxide films, namely thin-film and thick-film gate oxide films are used, it is desirable to use a thin-film gate oxide film for the antifuse element portion, and a thick-film gate oxide film for the grooved NMOS transistor. Further, a phosphorus doped polysilicon film having a thickness of 100 nm and an impurity concentration of 2e20 cm⁻³ for example is formed as a gate electrode 107.

Next, as shown in FIGS. 6A through 6C, ion implantation is conducted through a phosphorus doped polysilicon film to provide a channel-doped region and a source/drain diffusion region in the grooved memory cell portion and antifuse element portion. For this purpose, a resist pattern 108 is formed to cover the NMOS transistor portion while leaving the grooved memory cell portion and antifuse element portion open. Thereafter, boron is implanted at a dose of 5e12 cm⁻² at 70 keV, for example. This boron implantation forms a second P-type channel doped region 109 in the grooved memory cell portion for control of threshold voltage (Vt) of the grooved NMOS transistor, and also forms a second P-type channel doped region 109 in the antifuse element portion. The second P-type channel doped region 109 in the antifuse element portion is formed by only increasing the concentration of the P-type semiconductor substrate.

Further, phosphorus is implanted at a dose of 1e13 cm⁻² at 80 keV, for example. This phosphorus implantation forms an N⁻ diffusion layer 110 in the source/drain diffusion region of the grooved NMOS transistor and in the surface region of the P-type semiconductor substrate 101 of the antifuse element portion, as shown in FIGS. 6A and 6C. The surface region of the P-type semiconductor substrate 101 in the antifuse element portion is inverted to N type by this N⁻ diffusion layer region 110, and is connected to a source/drain diffusion region to be described later with a low resistance. The boron implantation and the phosphorus implantation are conducted using the same resist pattern. The implantation energy and the dose amount are set such that the boron ions are implanted to a deep region from the surface of the P-type semiconductor substrate while the phosphorus ions are implanted to a shallow region from the surface of the P-type semiconductor substrate.

Subsequently, as shown in FIGS. 7A through 7C, the gate electrode 107 is patterned to a desired pattern. An N⁺ source/drain diffusion region 111 is formed in the transistor of each of the NMOS transistor portion and the antifuse element portion by a commonly used technique, as shown in FIGS. 7B and 7C. It should be noted that, in FIGS. 3 to 7, only the main points of the invention are illustrated for the purpose of simplification. For example, a tungsten film may be formed prior to the gate patterning to reduce the layer resistance of the gate electrode. Further, a side-wall structure may be employed, or an LDD structure may be employed as a source/drain structure.

The method of manufacturing a semiconductor device according to the present invention forms the N⁻ diffusion layer to be the source/drain diffusion region of the grooved NMOS transistor simultaneously with the N⁻ diffusion layer of the channel region directly below the gate of the antifuse element. The formation of the N⁻ diffusion layer directly below the gate of the antifuse element ensures stable electrical connection between the gate electrode and the source/drain diffusion region even if the breakdown of the antifuse element caused by writing is small. Therefore, the writing to the antifuse element can be performed stably at a relatively low voltage. In addition, the simultaneous formation of the N⁻ diffusion layers eliminates the need of increasing the number of process steps or the cost especially for formation of the antifuse element, and enables low-cost manufacture of the semiconductor device. Thus, according to the manufacture method of a semiconductor device of the present invention, an antifuse element having a stable writing characteristic and a semiconductor device having such an antifuse element can be obtained without involving increase in the number of process steps or in the cost.

Although the present invention has been described in its preferred embodiments with a certain degree of particularity, the present invention is not limited to these embodiments but may be otherwise variously modified without departing from the true scope and spirit of the invention. It should be understood that all such modifications fall within the scope of the invention. For example, a capacitive element may be used in place of the antifuse element used in the present invention. Since the channel region is of N-type, the capacitive element will function stably without gate electrode dependence.

What is claimed is:

1. A method of manufacturing a semiconductor device having an antifuse element and a grooved transistor, comprising the steps of:
   forming a groove for the grooved transistor;
   forming a gate insulating film;
   forming a gate electrode film; and
   simultaneously forming a diffusion layer in a source/drain diffusion region of the grooved transistor and in a channel region for the antifuse element.

2. The method according to claim 1, wherein the diffusion layer is formed by implanting ions from above the gate electrode film.

3. The method according to claim 2, wherein the diffusion layer formation step introduces an impurity into a shallow region from a surface of a semiconductor substrate by phosphorus ion implantation using phosphorus as a source.

4. The method according to claim 3, wherein the diffusion layer formation step dopes a channel region of the grooved transistor by boron ion implantation prior to conducting the phosphorus ion implantation.

5. The method according to claim 4, wherein a depth of the phosphorus ion implantation is smaller than a depth of the boron ion implantation.

6. The method according to claim 5, wherein boron is introduced underneath the channel region of the antifuse element by the boron ion implantation.

7. The method according to claim 5, wherein boron is introduced into an underside region of the source/drain diffusion region of the grooved transistor by the boron ion implantation.

8. The method according to claim 5, wherein the boron ion implantation and the phosphorus ion implantation are performed by the use of a same resist pattern to implant the boron ions and the phosphorus ions, respectively.

9. A method of manufacturing a semiconductor device having an antifuse element region and a grooved transistor region on a semiconductor substrate, comprising:
   forming a groove by removing a part of the semiconductor substrate in the antifuse element region;
   forming a gate insulating film on a surface of the semiconductor substrate in the antifuse element region and the grooved transistor region;
   forming a gate electrode film on the gate insulating film in the antifuse element region and the grooved transistor region;
   implanting impurity atoms into the semiconductor substrate by penetrating the gate electrode film, and simultaneously forming a diffusion layer in a source/drain region of the grooved transistor and in a channel region of the antifuse element, wherein the source/drain region is formed outside of the groove in the grooved transistor region; and
   forming a first gate electrode in the antifuse element region and a second gate electrode in the grooved transistor region by patterning the gate electrode film, wherein the channel region is formed under the first gate electrode in the antifuse element region.

10. The method according to claim 9, wherein a conduction type of the semiconductor substrate is P-type, the gate electrode film Comprises an N-type poly silicon film, and N-type impurity atoms are implanted into the semiconductor substrate by penetrating the gate electrode film.

11. The method according to claim 10, further comprising implanting boron atoms into the semiconductor substrate by penetrating the gate electrode film on the gate insulating film.

12. The method according to claim 11, wherein the N-type impurity atom is phosphorus, a dose of the phosphorus implantation being larger than a dose of the boron implantation.

13. The method according to claim 11, wherein the boron atoms are implanted under the channel region of the antifuse element.

14. The method of according to claim 11, wherein the boron atoms are implanted under the source/drain region of the grooved transistor.

* * * * *